US009007773B2

(12) United States Patent
Warren et al.

(10) Patent No.: US 9,007,773 B2
(45) Date of Patent: Apr. 14, 2015

(54) HOUSING UNIT WITH HEAT SINK

(75) Inventors: Gary Warren, Aurora (CA); Darren Van Roon, Bowmanville (CA); Steve Steane, Courtice (CA); Reginald C. Grills, Oshawa (CA)

(73) Assignee: Flextronics AP, LLC, Broomfield, CO (US)

( * ) Notice: Subject to any disclaimer, the term of this patent is extended or adjusted under 35 U.S.C. 154(b) by 316 days.

(21) Appl. No.: 13/601,421

(22) Filed: Aug. 31, 2012

(65) Prior Publication Data

US 2014/0063745 A1 Mar. 6, 2014

(51) Int. Cl.
*H05K 7/20* (2006.01)

(52) U.S. Cl.
CPC ........ *H05K 7/20418* (2013.01); *H05K 7/20854* (2013.01)

(58) Field of Classification Search
CPC .................. H05K 7/2039–7/20518; H05K 7/20845–7/20881
USPC .............. 361/679.46–679.54, 688–723, 752, 361/755, 759; 174/16.3, 526, 547–548
See application file for complete search history.

(56) References Cited

U.S. PATENT DOCUMENTS

| 5,475,566 | A | * | 12/1995 | Rada et al. ..................... 361/736 |
| 5,691,878 | A | * | 11/1997 | Ahn et al. ...................... 361/674 |
| 5,708,566 | A | | 1/1998 | Hunninghaus et al. |
| 5,777,844 | A | * | 7/1998 | Kiefer .............................. 361/704 |
| 5,812,375 | A | * | 9/1998 | Casperson ..................... 361/707 |
| 5,926,944 | A | * | 7/1999 | Smith et al. ..................... 29/602.1 |
| 6,025,991 | A | * | 2/2000 | Saito .............................. 361/704 |
| 6,111,760 | A | * | 8/2000 | Nixon ............................. 361/814 |
| 6,137,680 | A | * | 10/2000 | Kodaira et al. ................ 361/697 |
| 6,434,000 | B1 | * | 8/2002 | Pandolfi ..................... 361/679.33 |
| 6,894,891 | B2 | * | 5/2005 | Darr et al. ...................... 361/601 |
| 7,924,565 | B2 | * | 4/2011 | Huang et al. .................. 361/700 |
| 8,254,128 | B2 | * | 8/2012 | Yasui ............................. 361/711 |
| 8,902,588 | B2 | * | 12/2014 | Ritter et al. .................... 361/692 |
| 2002/0154487 | A1 | * | 10/2002 | Weischhoff Van Rijn .... 361/719 |
| 2004/0014337 | A1 | | 1/2004 | Throum |
| 2008/0285224 | A1 | * | 11/2008 | Odanaka et al. ............... 361/683 |
| 2014/0198456 | A1 | * | 7/2014 | Bose et al. ..................... 361/720 |

FOREIGN PATENT DOCUMENTS

DE 202011107726 U1 12/2011

OTHER PUBLICATIONS

International Search Report and Written Opinion for corresponding International application No. PCT/US2013/057013, dated Dec. 3, 2013; 10 pages.

* cited by examiner

*Primary Examiner* — Zachary M Pape
(74) *Attorney, Agent, or Firm* — Volpe and Koenig, P.C.

(57) ABSTRACT

Described herein is an apparatus for dissipating or transferring heat from electronics secured in a housing unit. A housing unit includes a cover having a first fastener part and a base having a second fastener part. The base further includes a support structure for holding a printed circuit board (PCB) with mounted electronic components. A heat sink is placed within the base. The first fastener part and the second fastener part lock the cover and base together, with the heat sink and the PCB being secured between the support structure and the cover.

20 Claims, 7 Drawing Sheets

HOUSING UNIT WITH HEAT SINK

FIELD OF INVENTION

This application is related to thermal management technology for electronics secured in a housing unit.

BACKGROUND

Various systems and apparatus require the use of housing units that secure electronics. These housing units generally prevent exposure of the electronics to a multitude of environmental factors and are adapted for connection to the systems and apparatus in strategic locations. For example, in a vehicle these housing units may contain control electronics for controlling lift gates, windows, windshield wipers, seats, acoustic devices and the like and may be placed in proximity to the controlled device.

The electronics contained in the housing units include processors, memory, and other heat generating components. Although the functionality performed by the electronics continues to increase, the size continues to decrease and the density continues to increase. As a result, heat dissipation or transfer from the electronics becomes critical.

SUMMARY

Described herein is an apparatus for dissipating or transferring heat from electronics secured in a housing unit. A housing unit includes a cover having a first fastener part and a base having a second fastener part. The base further includes a support structure for holding a printed circuit board (PCB) with mounted electronic components. A heat sink is placed within the base. The first fastener part and the second fastener part lock the cover and base together, with the heat sink and the PCB being secured between the support structure and the cover.

DETAILED DESCRIPTION

Figure 1:
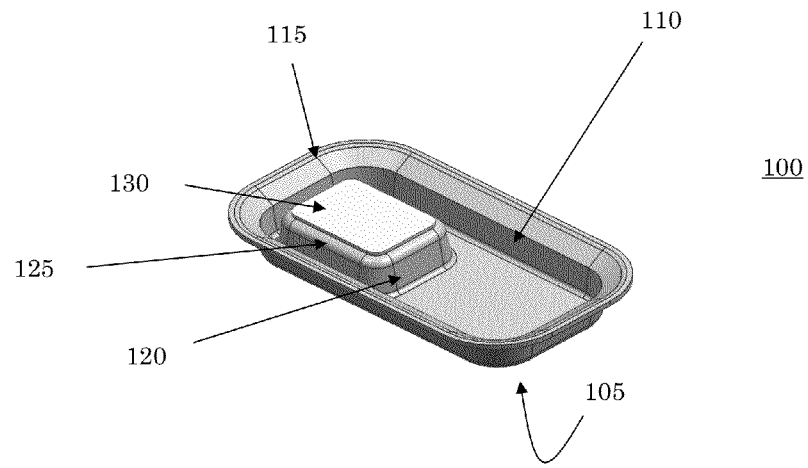
FIG. 1 is an example heat sink with a heat conductive pad.

It is to be understood that the figures and descriptions of embodiments of the housing unit with a heat sink have been simplified to illustrate elements that are relevant for a clear understanding, while eliminating, for the purpose of clarity, many other elements found in typical electronics packaging. Those of ordinary skill in the art may recognize that other elements and/or steps are desirable and/or required in implementing the housing unit with heat sink. However, because such elements and steps are well known in the art, and because they do not facilitate a better understanding of the housing unit with heat sink, a discussion of such elements and steps is not provided herein.

The non-limiting embodiments described herein are with respect to the housing unit with a heat sink. The embodiments and variations described herein, and/or shown in the drawings, are presented by way of example only and are not limiting as to the scope and spirit. The housing unit with heat sink may be used in a number of applications including automobile applications.

In general, housing units generally prevent exposure of electronics to a multitude of environmental factors and are adapted for connection to systems and apparatus in strategic locations. These electronics are nominally provided in the form a printed circuit board (PCB) that fits within the housing unit. These electronics may include processors, memory, and other heat generating components from which heat dissipation or transfer becomes critical.

FIG. 1 shows an example heat sink 100 with a heat conductive pad 130. The heat sink 100 has a top surface 105, a side wall structure 110 and a lip 115. The top surface 105 further includes a recessed portion 120 that permits the heat sink 100 to be in the proximity of the electronic component(s) requiring heat transfer. The top surface 105 may further include fins or other similar structures (not shown) to increase the surface area of the heat sink 100 and aid in heat transfer. The heat sink 100 may be, for example, a metal heat sink. The metal may be, but is not limited to, aluminum, copper, alloys and the like. The selection of the metal can provide electromagnetic shielding in addition to heat transfer. The heat sink 100 may be manufactured using a variety of techniques including, but not limited to, metal stamping, die-casting, extrusion, powder metal, and injection molding.

The heat conductive pad 130 is adhered to a bottom surface 125 of the recessed portion 120. The heat conductive pad 130 may be comprised of, but is not limited to, paraffin, silicone, acrylic, ceramic and like materials, where the materials may also be compressible. The heat conductive pad 130 assists in the transfer of heat away from the electronic component being cooled and into the heat sink 100. The heat conductive pad 130 may be adhered to the bottom surface 125 of the recessed portion 120 using, for example, heat transfer tape, a tacky external surface and the like.

Figure 2:
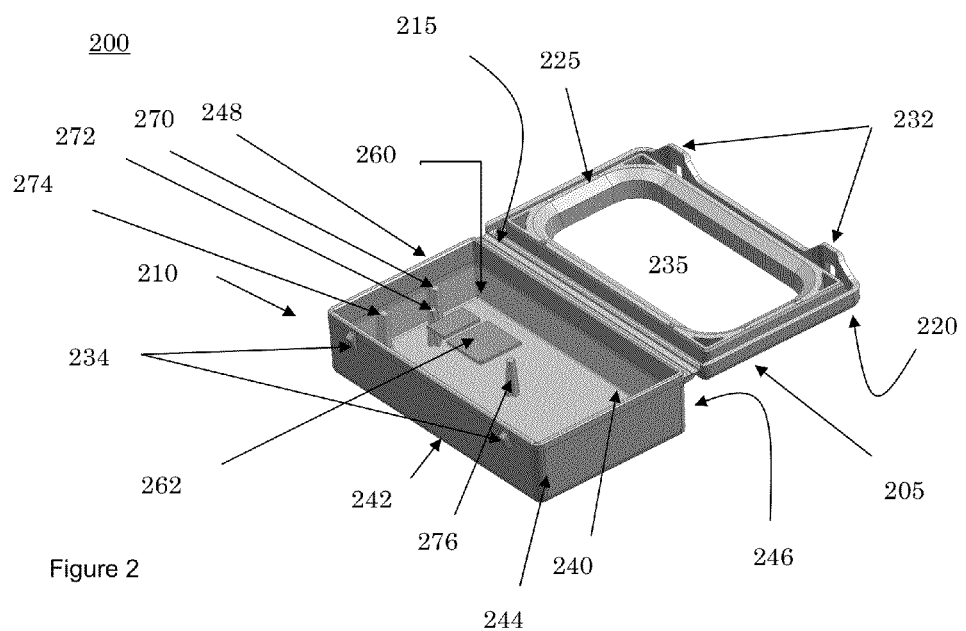
FIG. 2 is an example of a housing unit.

FIG. 2 shows an example housing unit 200 having a cover 205 and a base 210 connected via a hinge mechanism 215. The cover 205 includes a top surface 220, a side wall structure 225, and a part 232 of a fastening mechanism. The top surface 220 further includes an aperture 235. The dimensions and structure of the top surface 220, side wall structure 225 and aperture 235 correspond to the heat sink 100 of FIG. 1.

The base 210 includes a bottom surface 240, side wall structures 242, 244, 246 and 248, and a mating part 234 of the fastening mechanism. The base 210 further includes ribs 270 and 274 rising from the bottom surface 240 to a predetermined height on the side wall structures 248 and mirror image ribs on side wall structures 244 for supporting a printed circuit board (PCB) 260, where the PCB 260 is shown from a transparent perspective and has an area 262 from where heat transfer is designated. The area 262 is where electronic components on PCB 260 may require heat transfer. Support columns 272 and 276 may be included to provide additional support for the PCB 260, where the height of the support columns 272 and 276 are also of the predetermined height. As shown herein below, the predetermined height allows a heat sink structure, for example the heat sink or heat conductive pad, to be in near proximity to the area 262.

Figure 6:
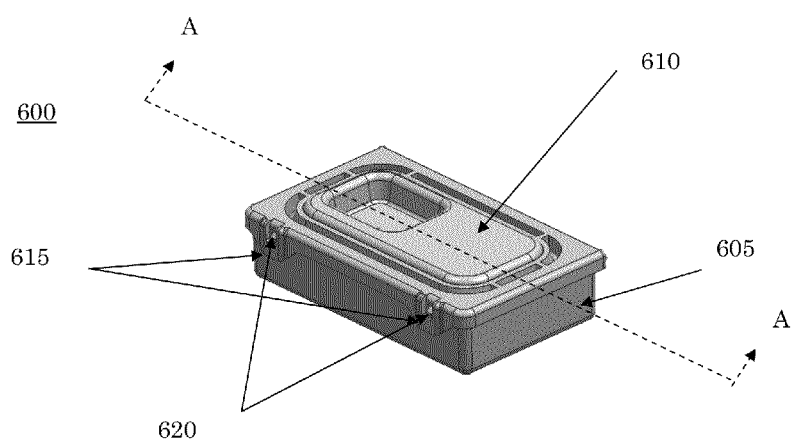
FIG. 6 is a view of closed housing unit with the heat sink.

As shown, the fastening mechanism includes two parts, the part 232 and the mating part 234. The fastening mechanism may be implemented using a variety of mechanisms. For example, the fastening mechanism may be a snap fit mechanism where the part 232 may be a pair of windowed tabs and the mating part 234 may be a pair of protrusions on an external surface of side wall structure 242. In a closed position, as shown in FIG. 6, the protrusions fit into the windowed tabs to seal the housing unit 200.

The housing unit 200 may be constructed from a variety of materials, including, but not limited to, plastic, and metal and may be manufactured using a variety of techniques including, but not limited to, extrusion, molding, stamping, die-casting and other methods. The housing unit 200 may be implemented as a separate cover and base or as a single piece. As stated herein, the hinge mechanism 215 connects the cover 205 to the base 210. The hinge mechanism 215 may be implemented using a variety of mechanisms. In the event the housing unit 200 is a single piece, the hinge mechanism 215 may an integrated plastic hinge.

Figure 3:
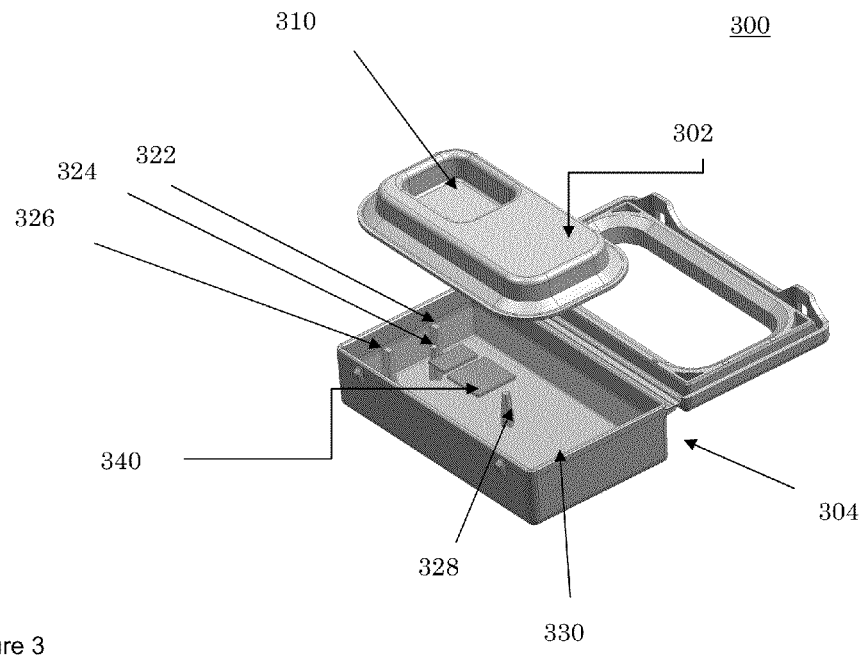
FIG. 3 is a view of a heat sink being positioned above a housing unit.
Figure 4:
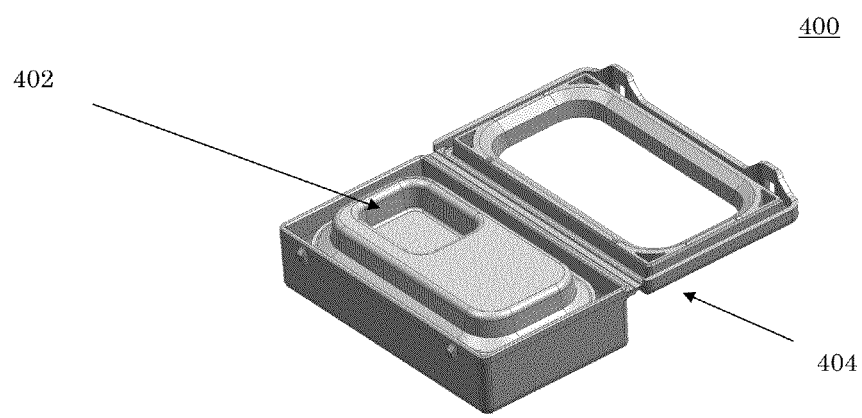
FIG. 4 is a view of a heat sink situated in a housing unit.

FIG. 3 shows an open assembly view 300 of an example heat sink 302 being positioned above an example housing unit 304. As described herein above, the heat sink 302 has a recessed portion 310 and the housing unit 304 ribs 322 and 326 and support columns 324 and 328, for example, for holding a PCB 330. The heat sink 302 is positioned such that the recessed portion 310 is above an area 340 of the PCB 330 from where heat transfer is designated. FIG. 4 shows a view 400 where a heat sink 402 is placed in a housing unit 404. In particular, the heat sink 402 is situated on a PCB (not shown).

Figure 5:
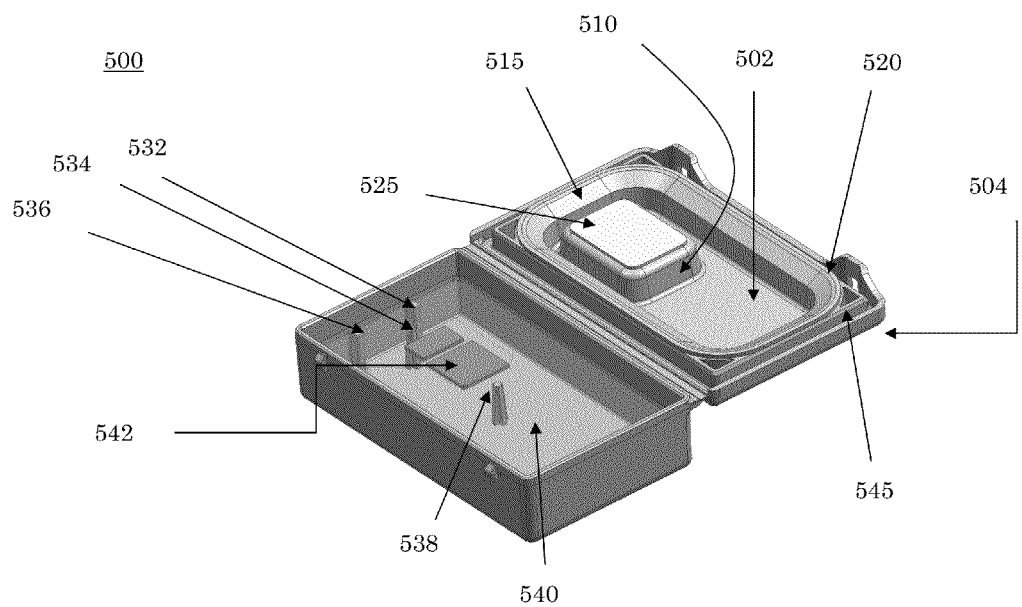
FIG. 5 is an alternative view of the heat sink situated in a housing unit.

FIG. 5 shows an alternative open assembly view 500 of an example heat sink 502 situated in an example housing unit 504. As described herein, the heat sink 502 may include a recessed portion 510, a side wall structure 515 and a lip 520. A heat conductive pad 525 may be adhered to a surface of the recessed portion 510. The housing unit 504 has ribs 532 and 536 and support columns 534 and 538, for example, for holding a PCB 540. The PCB 540 has an area 542 designated for heat transfer. The housing unit 504 further includes a side wall structure 545 and an aperture (not visible). As illustrated, the side wall structure 545 and aperture are dimensioned to accept the side wall structure 515 and lip 520 of the heat sink 502.

FIG. 6 shows a closed assembly view 600 of an example housing unit 605 with an example heat sink 610. As shown, windowed tabs 615 snap fit over protrusions 620 to secure tight housing unit 605. The top of the heat sink 610 is exposed to the external environment through an aperture as shown, for example, in see FIG. 2.

Figure 7:
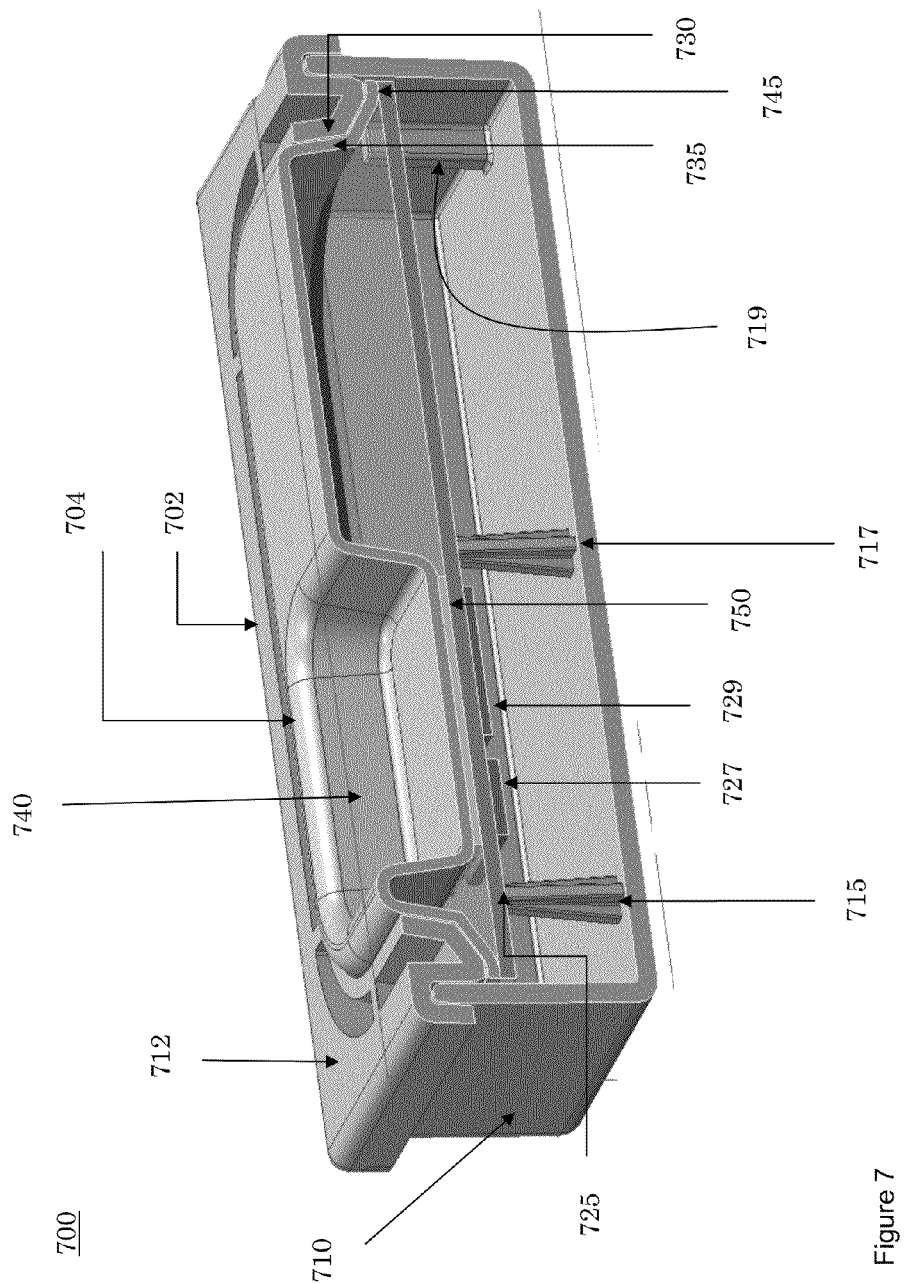
FIG. 7 is a cross-sectional view of the closed housing unit of FIG. 6.

FIG. 7 shows a cross-sectional view 700 of an example closed housing unit 702 with a heat sink 704 taken along line A-A of FIG. 6. As described herein, the housing unit 702 includes a base 710 that has supports columns 715, 717 and 719 upon which a PCB 725 rests. PCB 725 has components 727 and 729 from which heat transfer may be required. The housing unit 702 further includes a cover 712 that has a side wall structure 730 and an aperture (not visible). The heat sink 704 has a side wall structure 735, a recessed portion 740 and a lip 745. A heat conductive pad 750 is adhered to a surface of the recessed portion 740.

In a closed assembly position, the heat conductive pad 750 is situated above the components 727 and 729 for heat transfer to the heat sink 704. The mating characteristics between the side wall structure 730 and the side wall structure 735 and lip 745 permit the heat sink 704 to be held in place between the cover 712 and the PCB 725. This also secures the PCB 725 against the supports columns 715, 717 and 719 and along a shoulder when present. As a consequence, this housing unit structure eliminates the need for screws or other external means to secure the heat sink 704 to the housing unit 702 and the PCB 725 to the housing unit 702 or the heating unit 704. This also reduces the weight of the housing unit structure, costs and assembly time.

Figure 8:
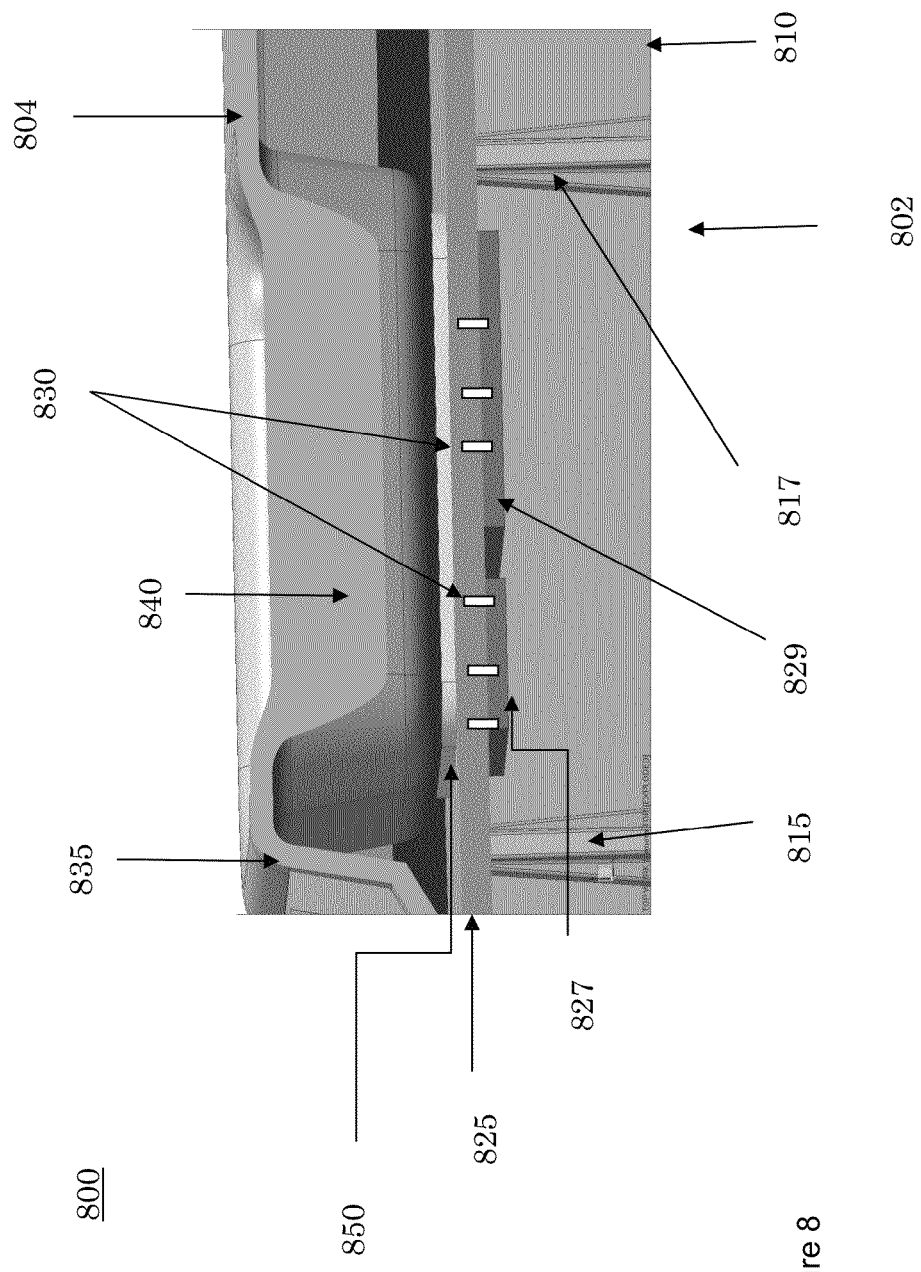
FIG. 8 is a partial cross-sectional view of a closed housing unit with vias.

FIG. 8 shows another partial cross-sectional view 800 of another example closed housing unit 802 with an example heat sink 804. As described herein, the heat sink 804 has a side wall structure 835, and a recessed portion 840. A heat conductive pad 850 is adhered to a surface of the recessed portion 840. The housing unit 802 includes a base 810 that has supports columns 815 and 817 upon which a PCB 825 rests. PCB 825 has components 827 and 829 from which heat transfer may be required. The PCB 825 may also include vias 830 that assist in conducting heat away from the components 827 and 829 through the PCB 825 and toward heat conductive pad 850 and eventually heat sink 804.

Figure 9:
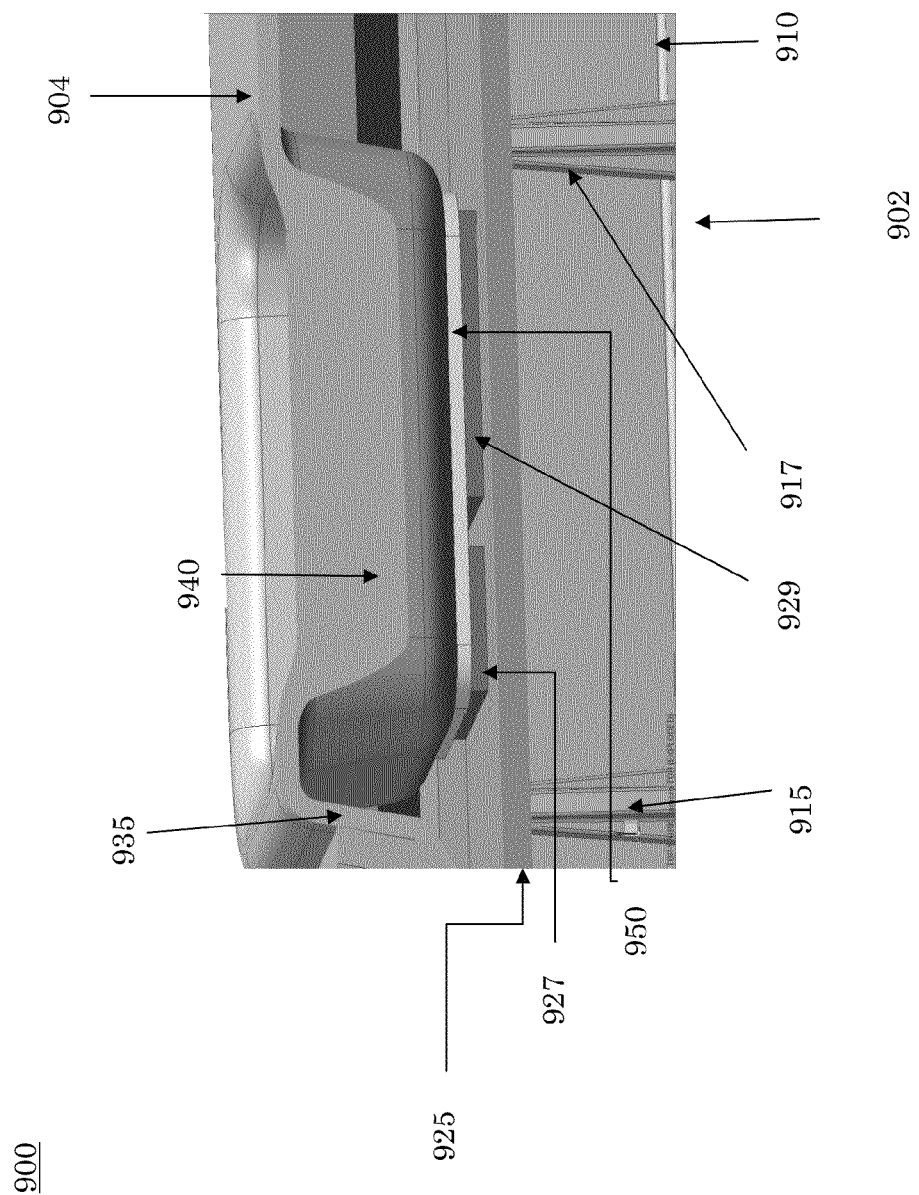
FIG. 9 is a partial cross-sectional view of a closed housing unit with heat sink directly contacting component.

FIG. 9 shows another partial cross-sectional view 900 of an example closed housing unit 902 with an example heat sink 904 directly contacting components 927 and 929 through conductive pad 950. As described herein, the heat sink 904 has a side wall structure 935, and a recessed portion 940. A heat conductive pad 950 is adhered to a surface of the recessed portion 940. The housing unit 902 includes a base 910 that has a rib 915 and a support column 917 upon which a PCB 925 rests. The heat conductive pad 950 directly contacts components 927 and 929 through conductive pad 950 to transfer heat to the heat sink 904.

Figure 10:
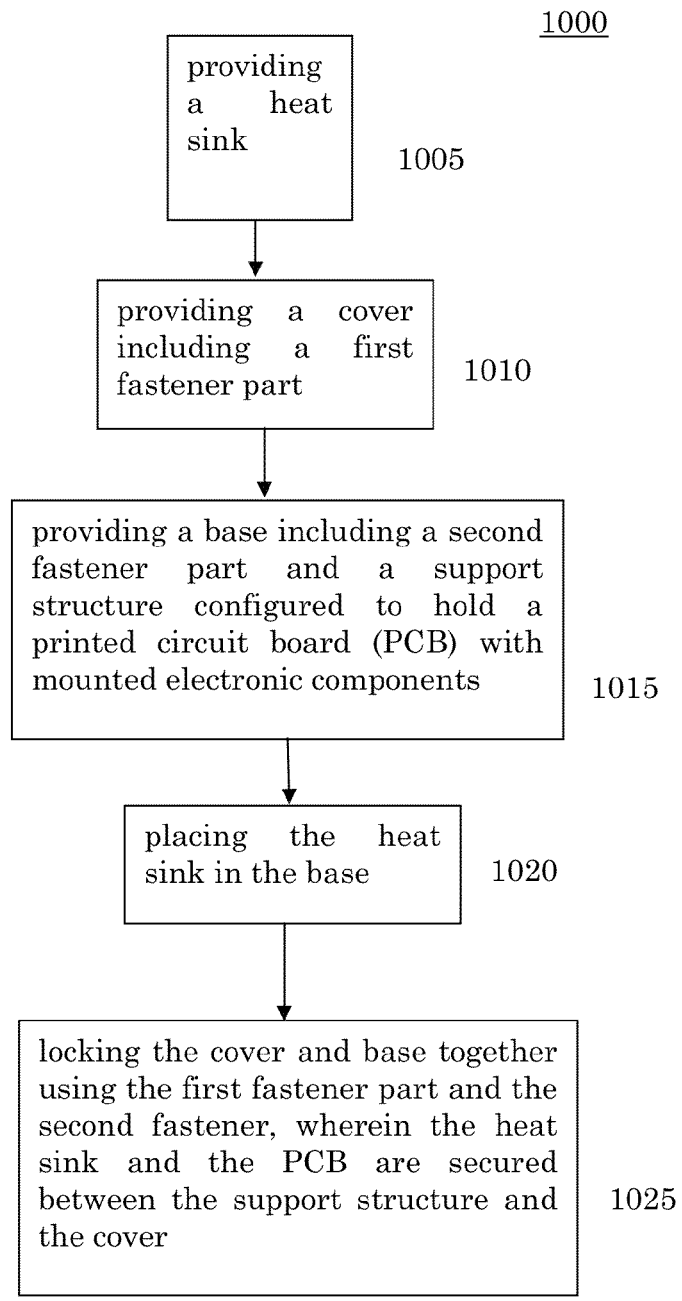
FIG. 10 is an example flowchart for providing a housing unit with a heat sink.

FIG. 10 shows an example flowchart 1000 for transferring heat from a housing unit with electronic components. A heat sink is provided (1005). A cover including a first fastener part (1010) and a base including a second fastener part and a support structure to hold a printed circuit board (PCB) with mounted electronic components is provided (1015). The heat sink is placed in the base (1020). The cover and base are locked together using the first fastener part and the second fastener with the heat sink and the PCB being secured between the support structure and the cover (1025).

Although features and elements are described above in particular combinations, each feature or element can be used alone without the other features and elements or in various combinations with or without other features and elements.

What is claimed is:

1. A housing unit for electronic components, comprising:
a heat sink comprising a lip;
a cover including a first fastener part and a side wall structure;
a base including a second fastener part and a support structure configured to support from below a printed circuit board (PCB) with mounted electronic components; and
the first fastener part and the second fastener part being configured to lock the cover and base together, wherein the heat sink is secured to the housing unit and the PCB is secured to the housing unit only by the lip and a sidewall structure of the heat sink and the PCB being disposed between the support structure and the side wall structure of the cover.

2. The housing unit of claim 1, wherein the heat sink includes a recessed portion configured to be proximate the mounted electronic components.

3. The housing unit of claim 1, wherein the support structure includes at least one of support column and at least one rib.

4. The housing unit of claim 1, wherein the heat sink includes a heat conduction pad.

5. The housing unit of claim 4, wherein the heat conduction pad is in direct contact with the mounted electronic components.

6. The housing unit of claim 4, wherein the PCB is configured with via holes and the heat conduction pad is in contact with the PCB.

7. The housing unit of claim 1, wherein the cover and the base are one piece.

8. A housing unit for a printed circuit board (PCB) with mounted electronic components, comprising:
   a heat sink comprising a lip;
   a cover including a side wall structure;
   a base configured with a support structure to support from below the PCB; and
   a fastener integrated with the cover and the base, wherein the fastener is configured to lock the cover and base to securely hold the heat sink to the housing unit and to securely hold the PCB to the housing unit only by the lip and a sidewall structure of the heat sink and the PCB being disposed between the support structure and the side wall structure of the cover.

9. The housing unit of claim 8, wherein the heat sink includes a recessed portion configured to be proximate the mounted electronic components.

10. The housing unit of claim 8, wherein the support structure includes support columns and ribs.

11. The housing unit of claim 8, wherein the heat sink includes a heat conduction pad.

12. The housing unit of claim 11, wherein the heat conduction pad is in direct contact with the mounted electronic components.

13. The housing unit of claim 11, wherein the PCB is configured with via holes and the heat conduction pad is in contact with the PCB.

14. A method for transferring heat in a housing unit for electronic components, comprising:
   providing a heat sink comprising a lip;
   providing a cover including a first fastener part and a side wall structure;
   providing a base including a second fastener part and a support structure configured to support from below a printed circuit board (PCB) with mounted electronic components;
   placing the PCB in the base so that the PCB is supported on the support structure;
   placing the heat sink in the base; and
   locking the cover and base together using the first fastener part and the second fastener part, wherein the heat sink is secured to the housing unit and the PCB is secured to the housing unit only by the lip and a sidewall structure of the heat sink and the PCB being disposed between the support structure and the side wall structure of the cover.

15. The method of claim 14, wherein the heat sink includes a recessed portion configured to be proximate the mounted electronic components.

16. The method of claim 14, wherein the support structure includes at least one of support columns and at least one rib.

17. The method of claim 14, wherein the heat sink includes a heat conduction pad.

18. The method of claim 17, wherein the heat conduction pad is in direct contact with the mounted electronic components.

19. The method of claim 17 wherein the PCB is formed with via holes and the heat conduction pad is in contact with the PCB.

20. The method of claim 14, wherein the cover and the heat sink have matched side wall structures.

\* \* \* \* \*